United States Patent
Wang

(10) Patent No.: US 8,991,043 B2
(45) Date of Patent: Mar. 31, 2015

(54) MANUFACTURING METHOD OF A CIRCUIT BOARD STRUCTURE

(75) Inventor: Chao-Min Wang, Hsinchu (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 257 days.

(21) Appl. No.: 13/553,787

(22) Filed: Jul. 19, 2012

(65) Prior Publication Data

US 2013/0092422 A1 Apr. 18, 2013

(30) Foreign Application Priority Data

Oct. 12, 2011 (TW) ............................. 100136994 A

(51) Int. Cl.
*H01K 3/10* (2006.01)
*H05K 3/24* (2006.01)
*H05K 3/46* (2006.01)
*H05K 3/10* (2006.01)

(52) U.S. Cl.
CPC ........ *H05K 3/244* (2013.01); *H05K 2203/1572* (2013.01); *H05K 3/108* (2013.01); *H05K 3/4652* (2013.01); *H05K 2203/0361* (2013.01); *H05K 2203/0574* (2013.01); *H05K 2203/1461* (2013.01)
USPC ................... 29/852; 29/825; 29/830; 29/832; 29/840

(58) Field of Classification Search
USPC .................... 29/825, 830, 832, 833, 840, 852
See application file for complete search history.

(56) References Cited

U.S. PATENT DOCUMENTS

| | | | |
|---|---|---|---|
| 5,504,992 A | 4/1996 | Fukutomi et al. | |
| 6,884,945 B2 * | 4/2005 | Kim et al. | 174/262 |
| 7,196,426 B2 * | 3/2007 | Nakamura et al. | 257/778 |
| 8,161,637 B2 * | 4/2012 | Mizutani et al. | 29/852 |
| 8,207,450 B2 * | 6/2012 | An et al. | 174/261 |
| 2007/0130762 A1 * | 6/2007 | Nakamura | 29/830 |
| 2009/0001550 A1 * | 1/2009 | Li et al. | 257/700 |

FOREIGN PATENT DOCUMENTS

| | | |
|---|---|---|
| CN | 101145552 | 3/2008 |
| CN | 101610646 | 12/2009 |

(Continued)

OTHER PUBLICATIONS

"Office Action of Taiwan Counterpart Application", issued on Jun. 14, 2013, p. 1-p. 9.

(Continued)

*Primary Examiner* — Carl Arbes
(74) *Attorney, Agent, or Firm* — Jianq Chyun IP Office

(57) ABSTRACT

A circuit board structure includes a core circuit structure, a first and a second dielectric layers, a first and a second conductive blind via structures, a third and a fourth patterned circuit layers, and a first and a second surface passivation layers. The first and the second dielectric layers have at least one first and second blind vias exposing parts of a first and a second patterned circuit layers of the core circuit structure, respectively. The first and the second conductive blind via structures are disposed into the first and the second blind vias respectively. The third and the fourth patterned circuit layers are electrically connected to the first and the second patterned circuit layers through the first and the second conductive blind via structures respectively. The first and the second surface passivation layers respectively expose parts of the third and the fourth patterned circuit layers.

8 Claims, 10 Drawing Sheets

(56) References Cited

FOREIGN PATENT DOCUMENTS

| | | |
|---|---|---|
| CN | 101937901 | 1/2011 |
| TW | 200524490 | 7/2005 |
| TW | 201003859 | 1/2010 |

OTHER PUBLICATIONS

"Office Action of Chinese Counterpart Application", issued on Dec. 11, 2014, p1-p8, in which the listed references were cited.

* cited by examiner

MANUFACTURING METHOD OF A CIRCUIT BOARD STRUCTURE

CROSS-REFERENCE TO RELATED APPLICATION

This application claims the priority benefit of Taiwan application serial no. 100136994, filed on Oct. 12, 2011. The entirety of the above-mentioned patent application is hereby incorporated by reference herein and made a part of this specification.

BACKGROUND OF THE INVENTION

1. Field of the Invention

The present invention relates to a circuit board structure and a manufacturing method thereof, and in particular to a circuit board structure without a plating line and a manufacturing method thereof.

2. Description of Related Art

In recent years, with the rapid progress of electronic technologies, and the increasing development of high-tech electronic industries, more humanistic electronic products with better functions continuously innovate and develop to a light, thin, short and small trend. Under the trend, since a circuit board has the advantages of fine wiring, compact assembly and desirable performance, the circuit board becomes a main medium for carrying multiple electronic elements and enabling the electronic elements to be electrically connected to each other.

In the prior art, during manufacturing of the circuit board, an external circuit layer and a patterned solder mask layer are manufactured, and then an anti-oxidization layer is plated on surfaces of multiple bonding pads formed by the circuit layer, such as a nickel-gold layer, so as to prevent surfaces of the bonding pads made of copper from being oxidized and increase bond strength of the bonding pads during welding. Moreover, the anti-oxidization layer is rapidly formed through the plating manner.

In order to perform a plating process on the surfaces of the bonding pads, the bonding pads may be respectively connected to a plating bar, and then are electrically connected to an external power supply. In addition, after the anti-oxidization layer is completed through plating, the plating bar is removed or cut off the connection between the plating bar and the bonding pads, so that the bonding pads are electrically insulated from each other. However, the bonding bar occupies limited circuit layout space on the circuit board, which reduces freeness of the circuit layout on the circuit layer.

SUMMARY OF THE INVENTION

The present invention provides a circuit board structure, which has great freeness in circuit layout.

The present invention provides a manufacturing method of a circuit board structure, to manufacture the circuit board structure.

The present invention provides a circuit board structure, which includes a core circuit structure, a first dielectric layer, a second dielectric layer, a first conductive blind via structure, a second conductive blind via structure, a third patterned circuit layer, a fourth patterned circuit layer, a first surface passivation layer, and a second surface passivation layer. The core circuit structure has a first patterned circuit layer and a second patterned circuit layer, which are respectively located on two opposite sides of the core circuit structure. The first dielectric layer is superimposed on one side of the core circuit structure, and has at least one first blind via exposing a part of the first patterned circuit layer. The second dielectric layer is superimposed on the other side of the core circuit structure, and has at least one second blind via exposing a part of the second patterned circuit layer. The first conductive blind via structure is configured in the first blind via. The second conductive blind via structure is configured in the second blind via. The third patterned circuit layer is configured on the first dielectric layer, exposes a part of the first dielectric layer, and is electrically connected to the first patterned circuit layer through the first conductive blind via structure. The fourth patterned circuit layer is configured on the second dielectric layer, exposes a part of the second dielectric layer, and is electrically connected to the second patterned circuit layer through the second conductive blind via structure. The first surface passivation layer is configured on the third patterned circuit layer, and exposes a part of the third patterned circuit layer. The second surface passivation layer is configured on the fourth patterned circuit layer, and exposes a part of the fourth patterned circuit layer.

The present invention further provides a manufacturing method of a circuit board structure, which includes the following steps: compressing a first dielectric layer and a first copper foil layer located on the first dielectric layer onto a first patterned circuit layer of a core circuit structure, and compressing a second dielectric layer and a second copper foil layer located on the second dielectric layer onto a second patterned circuit layer of the core circuit structure, in which the first patterned circuit layer and the second patterned circuit layer are respectively located on two opposite sides of the core circuit structure; forming at least one first blind via extending from the first copper foil layer to the first patterned circuit layer, and forming at least one second blind via extending from the second copper foil layer to the second patterned circuit layer, in which the first blind via and the second blind via respectively expose parts of the first patterned circuit layer and the second patterned circuit layer; forming a first plating seed layer on the first copper foil layer and in the first blind via, and forming a second plating seed layer on the second copper foil layer and in the second blind via, in which the first plating seed layer and the second plating seed layer respectively cover an inner wall of the first blind via and an inner wall of the second blind wall; forming a first conductive blind via structure and a second conductive blind via structure in the first blind via and the second blind via respectively, in which the first conductive blind via structure and the second conductive blind via structure are respectively aligned with the first plating seed layer located on the first copper foil layer and the second plating seed layer located on the second copper foil layer; forming a third patterned circuit layer and a fourth patterned circuit layer on the first plating seed layer and the second plating seed layer respectively, in which the third patterned circuit layer and the fourth patterned circuit layer are electrically connected to the first patterned circuit layer and the second patterned circuit layer respectively through the first conductive blind via structure and the second conductive blind via structure; forming a first surface passivation layer and a second surface passivation layer on the third patterned circuit layer and the fourth patterned circuit layer respectively; Using the first surface passivation layer and the second surface passivation layer as etching masks to remove a part of the first plating seed layer and a part of the first copper foil layer below the first plating seed layer and a part of the second plating seed layer and a part of the second copper foil layer below the second plating seed layer that are exposed out of the third patterned circuit layer and the fourth patterned circuit layer, to expose the first dielectric layer and the second dielectric layer; and removing a part of the first surface passivation layer and a part of the second surface passivation layer, to expose a part of the third patterned circuit layer and a part of the fourth patterned circuit layer.

Based on the above description, since in the present invention, the surface passivation layer is first formed on the patterned circuit layer through the patterned photoresist layer, and the surface passivation layer is used as the etching masks to remove the copper foil layer exposed out of the patterned circuit layer, to expose the dielectric layer, the present invention is not required to first form the conventional plating bar in the circuit layer, and the surface passivation layers can be formed on the surface of a bonding pad to be formed by the circuit layer. In this way, the circuit board structure of the present invention may have great freeness in circuit layout.

In order to make the features and advantages of the present invention more comprehensible, the present invention is described in detail in the following with reference to the embodiments and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
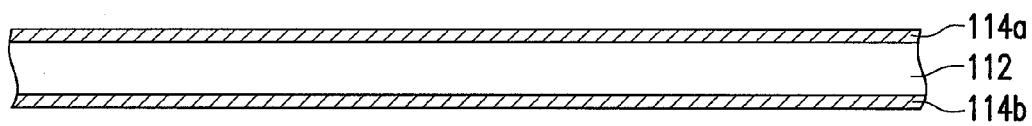
FIG. 1A to FIG. 1Q are schematic sectional diagrams of a manufacturing method of a circuit board structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 1B:
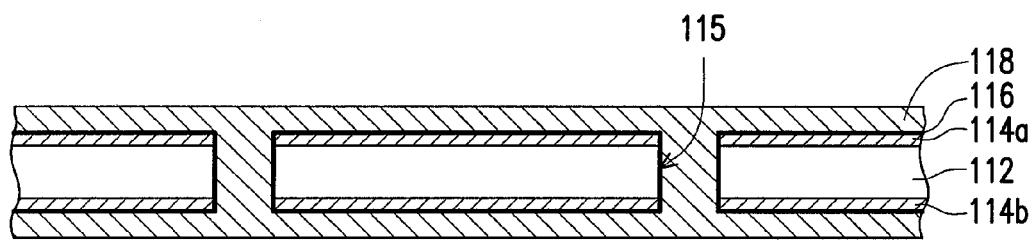
FIG. 1R to FIG. 1T are schematic sectional diagrams of partial steps of a manufacturing method of a circuit board structure according to another embodiment of the present invention.
Figure 1C:
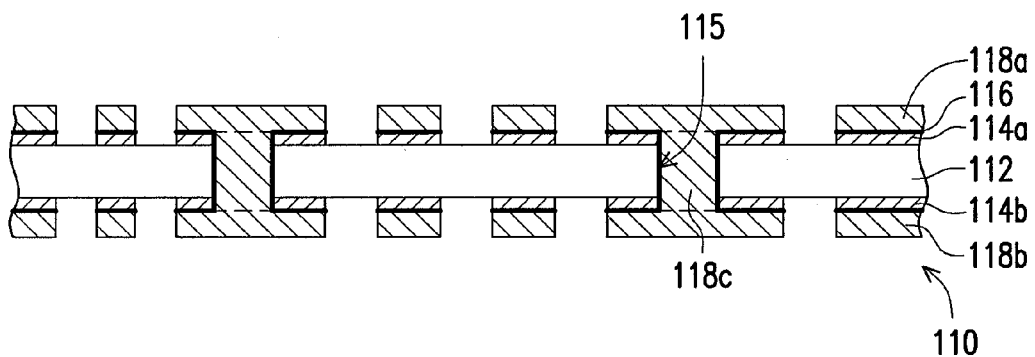
Figure 1D:
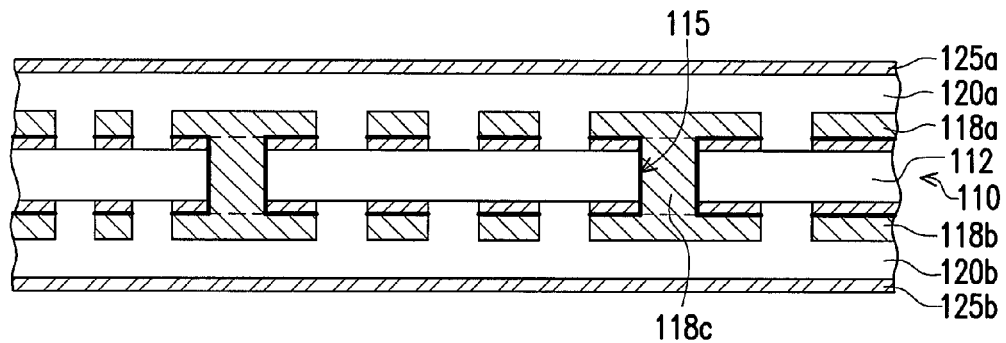
Figure 1E:
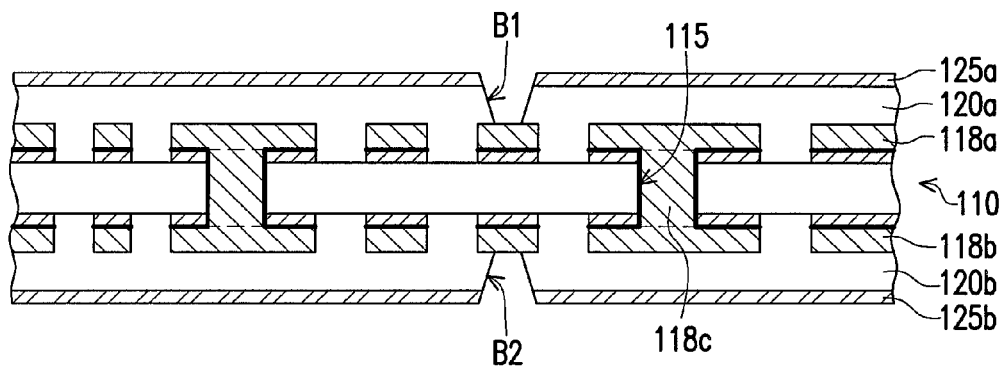
Figure 1F:
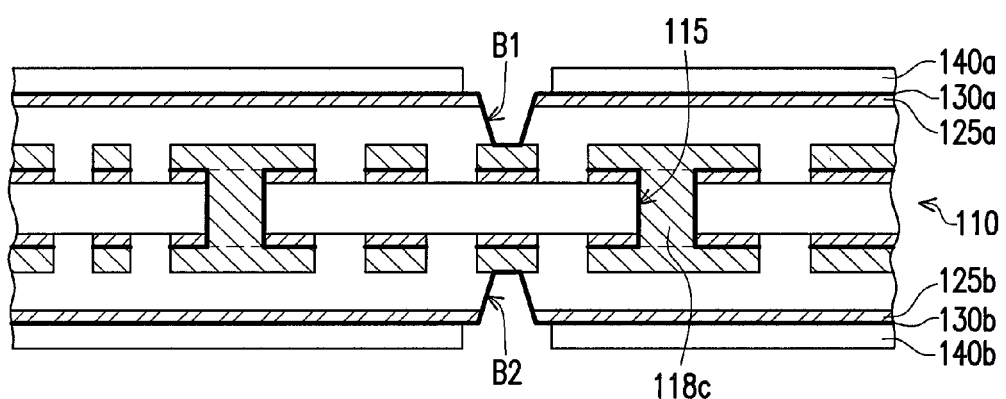
Figure 1G:
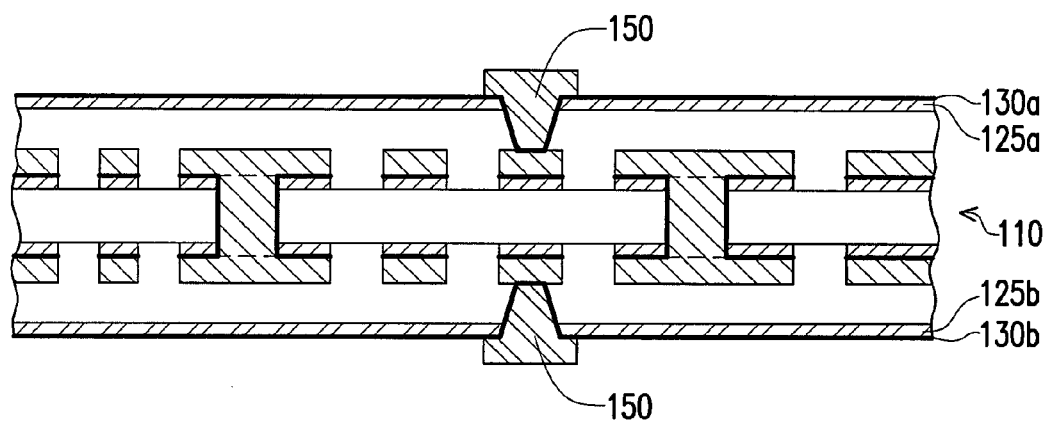
Figure 1H:
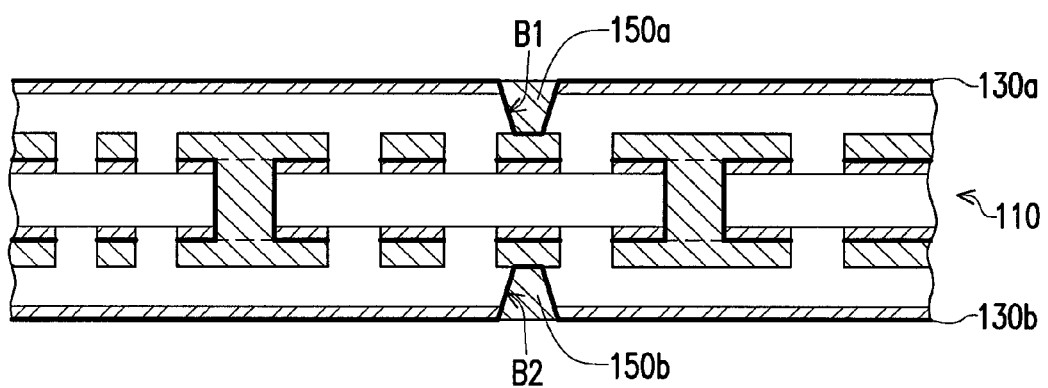
Figure 1I:
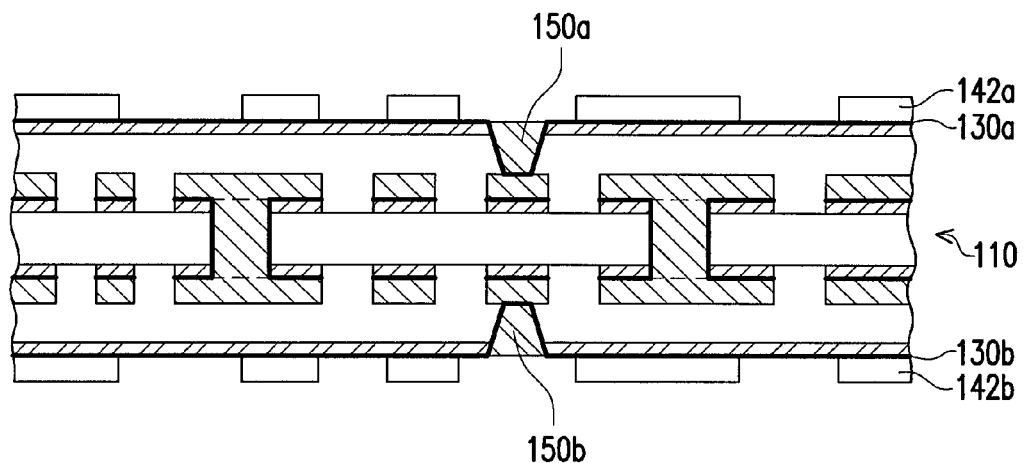
Figure 1J:
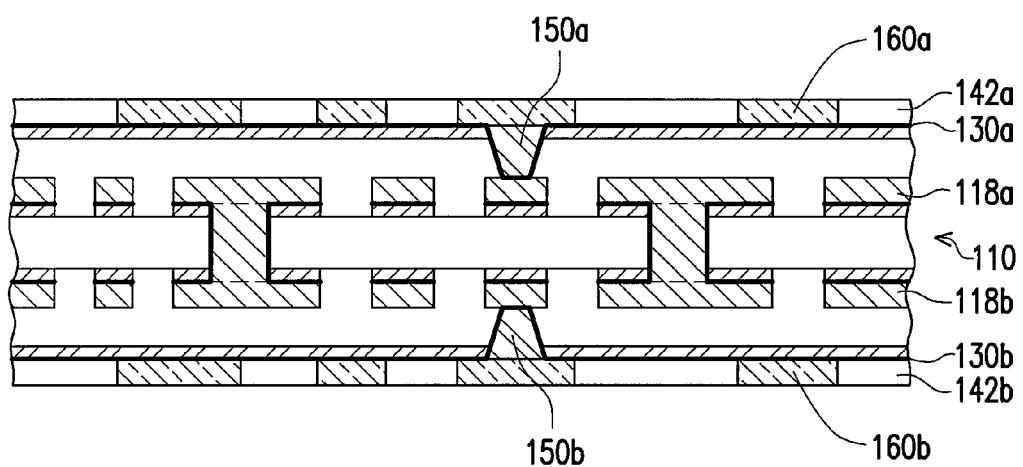
Figure 1K:
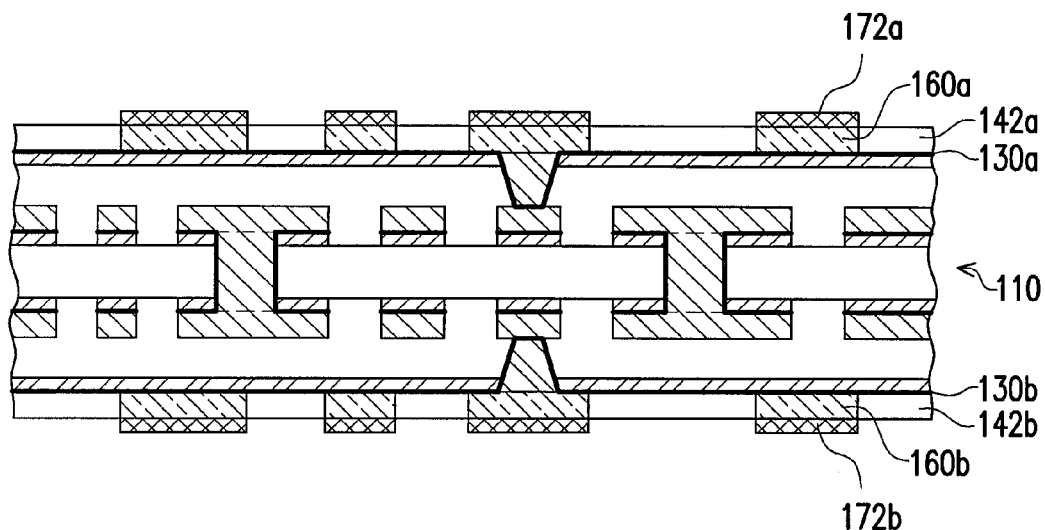
Figure 1L:
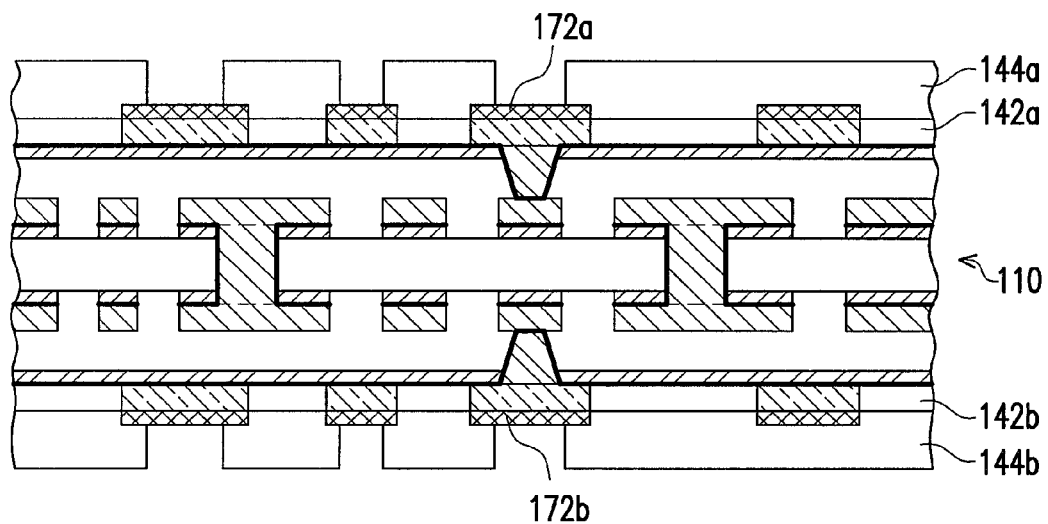
Figure 1M:
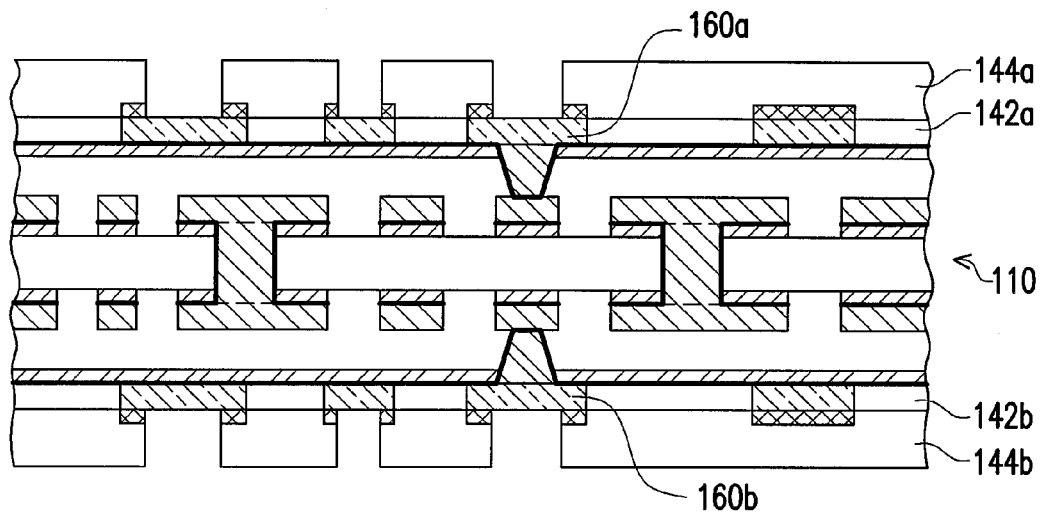
Figure 1N:
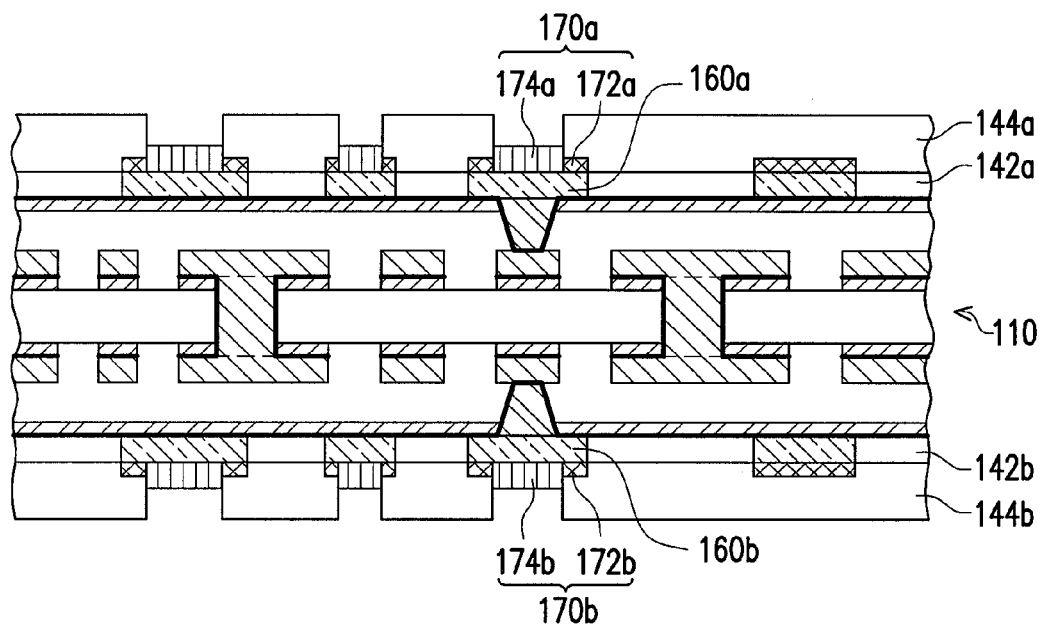
Figure 1N:
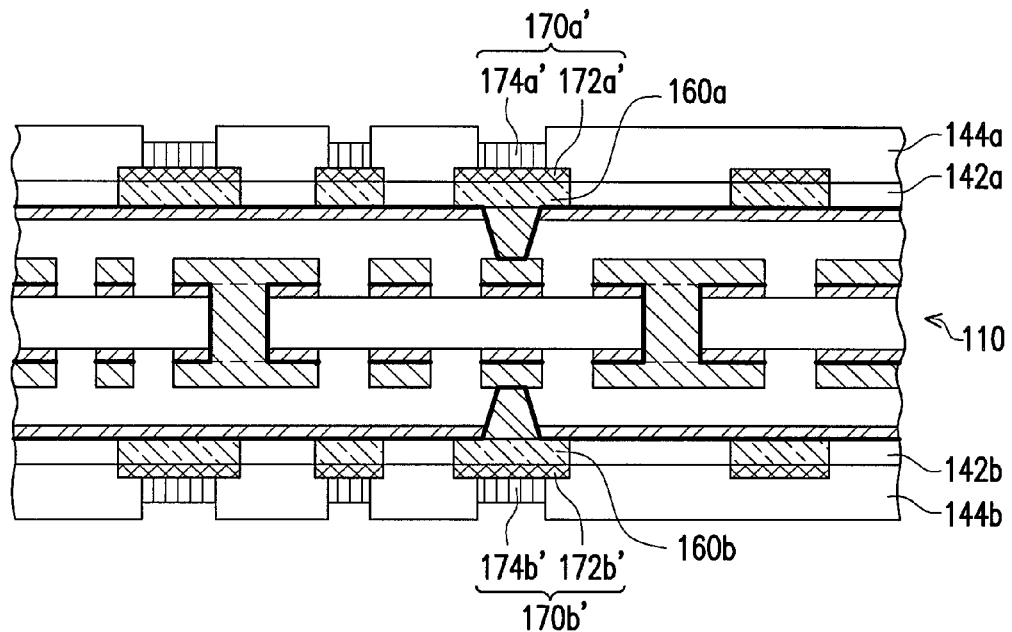
Figure 1O:
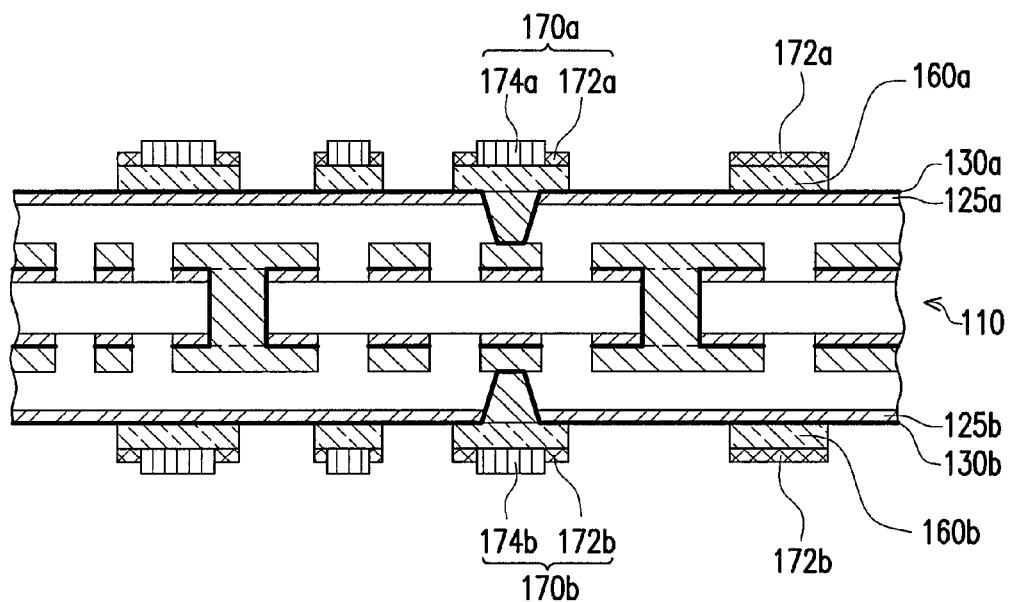
Figure 1P:
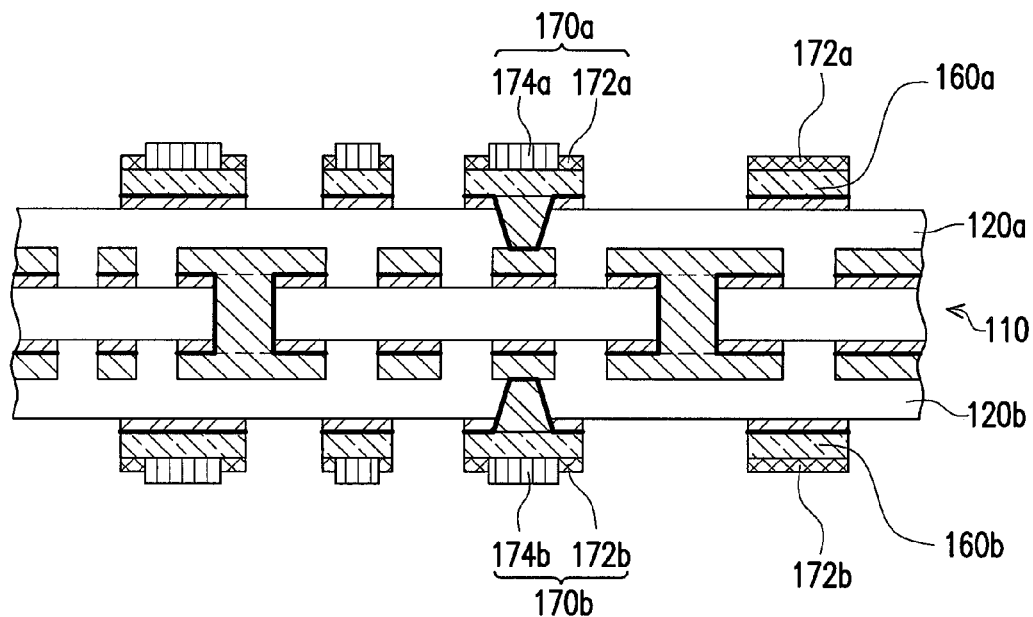
Figure 1Q:
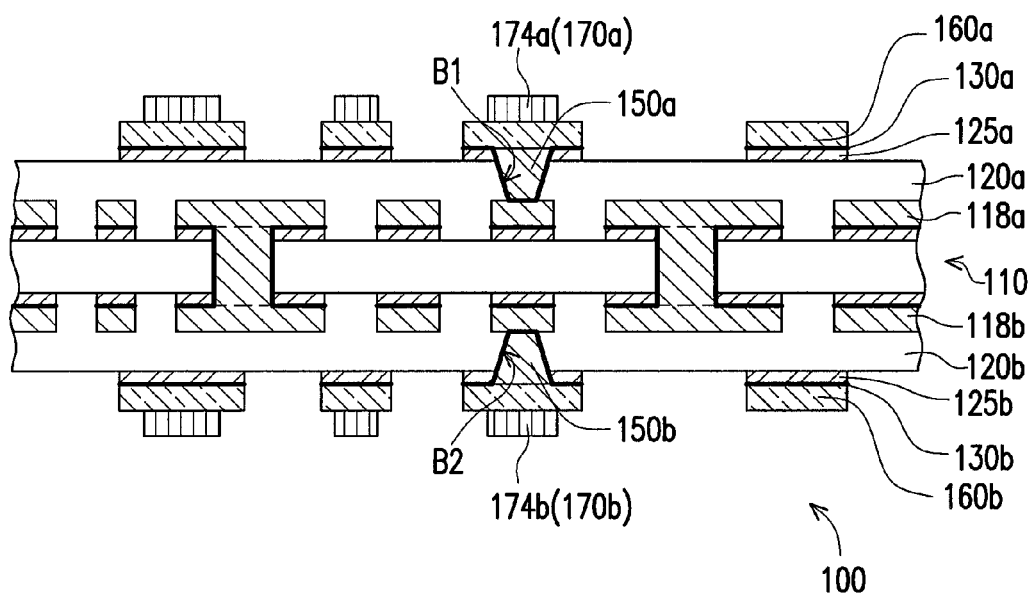

FIG. 1A to FIG. 1Q are schematic sectional diagrams of a manufacturing method of a circuit board structure according to an embodiment of the present invention. Referring to FIG. 1A first, according to a manufacturing method of a circuit board structure according to this embodiment, a core dielectric layer 112, and two core circuit layers 114a and 114b configured on surfaces of two opposite sides of the core dielectric layer 112 are provided.

Then, referring to FIG. 1B, multiple through holes 115 running through the core circuit layer 114a, the core dielectric layer 112 and the core circuit layer 114b are formed, and a seed layer 116 is formed on an inner wall of the through hole 115 and the surfaces of the core circuit layers 114a and 114b. Then, the seed layer 116 is used as a current path and is plated with a conductive material 118, in which the conductive material 118 covers the seed layer 116 above the core circuit layers 114a and 114b, and fills the through hole 115.

Afterwards, referring to FIG. 1C, the patterned conductive material 118 forms a first patterned circuit layer 118a on the core circuit layer 114a, and forms a second patterned circuit layer 118b on the core circuit layer 114b. The conductive material 118 in the through hole 115 may be considered as a conductive connection structure 118c, and the first patterned circuit layer 118a may be electrically connected to the second patterned circuit layer 118b through the conductive connection structure 118c. The manufacturing of the core circuit structure 110 has been completed by now.

It should be noted that, the core circuit structure 110 is merely taken as an example here, and the present invention is not limited thereto. In other embodiments which are not shown, the core circuit structure 110 may also be an odd-layer (for example, 3 or 5 layers) circuit structure or an even-layer (for example, 4 or 6 layers) circuit structure. Here, in this embodiment, the core circuit structure 110 is used as a bi-layer circuit structure for description, and the first patterned circuit layer 118a and the second patterned circuit layer 118b are respectively circuit structure layers at an outermost side of the core dielectric layer 112.

Then, referring to FIG. 1D, a first dielectric layer 120a and a first copper foil layer 125a located on the first dielectric layer 120a are compressed on the first patterned circuit layer 118a of the core circuit structure 110, and a second dielectric layer 120b and a second copper foil layer 125b located on the second dielectric layer 120b on the second patterned circuit layer 118b of the core circuit structure 110. The first dielectric layer 120a and the second dielectric layer 120b respectively cover the first patterned circuit layer 118a, the second patterned circuit layer 118b and a part of the core dielectric layer 112 exposed by the first patterned circuit layer 118a and the second patterned circuit layer 118b.

Then, referring to FIG. 1E, at least one first blind via B1 extending from the first copper foil layer 125a to the first patterned circuit layer 118a is formed, and at least one second blind via B2 extending from the second copper foil layer 125b to the second patterned circuit layer 118b is formed, in which the first blind via B1 and the second blind via B2 respectively expose parts of the first patterned circuit layer 118a and the second patterned circuit layer 118b. Here, a method for forming the first blind via B1 and the second blind via B2 is, for example, a laser drilling method.

Then, referring to FIG. 1F, a first plating seed layer 130a is formed on the first copper foil layer 125a and in the first blind via B1, and a second plating seed layer 130b is formed on the second copper foil layer 125b and in the second blind via B2, in which the first plating seed layer 130a and the second plating seed layer 130b respectively cover an inner wall of the first blind via B1 and an inner wall of the second blind via B2. A first photoresist layer 140a and a second photoresist layer 140b are respectively formed on the first plating seed layer 130a and the second plating seed layer 130b, and expose at least one part of the first plating seed layer 130a and at least one part of the second plating seed layer 130b respectively located on the first blind via B1 and the second blind via B2.

Referring to FIG. 1F and FIG. 1G, the first photoresist layer 140a and the second photoresist layer 140b are used as plating masks to plate a conductive material 150 on parts of the first plating seed layer 130a and the second plating seed layer 130b that are not covered by the first photoresist layer 140a and the second photoresist layer 140b. The first photoresist layer 140a and the second photoresist layer 140b are removed to expose a part of the first plating seed layer 130a and a part of the second plating seed layer 130b located on the first copper foil layer 125a and the second copper foil layer 125b.

Referring to FIG. 1H, a grinding step is performed to remove a part of the conductive material 150, to form a first conductive blind via structure 150a and a second conductive blind via structure 150b substantially aligned with the first plating seed layer 130a and the second plating seed layer 130b. In this way, the first conductive blind via structure 150a and the second conductive blind via structure 150b are formed in the first blind via B1 and the second blind via B2 respectively.

Referring to FIG. 1I, a first patterned photoresist layer 142a and a second patterned photoresist layer 142b are respectively formed on the first plating seed layer 130a and the second plating seed layer 130b, and expose a part of the first plating seed layer 130a, a part of the second plating seed layer 130b, the first conductive blind via structure 150a and the second conductive blind via structure 150b.

Referring to FIG. 1J, the first patterned photoresist layer 142a and the second patterned photoresist layer 142b are used as the plating masks to plate a third patterned circuit layer 160a and a fourth patterned circuit layer 160b on the first plating seed layer 130a and the second plating seed layer 130b exposed out of the first patterned photoresist layer 142a and the second patterned photoresist layer 142b. The third patterned circuit layer 160a and the fourth patterned circuit layer 160b are electrically connected to the first patterned circuit layer 118a and the second patterned circuit layer 118b respectively through the first conductive blind via structure 150a and the second conductive blind via structure 150b.

Referring to FIG. 1K, a first passivation layer 172a and a second passivation layer 172b are respectively formed on the third patterned circuit layer 160a and the fourth patterned circuit layer 160b, and cover a part of the first patterned photoresist layer 142a and the second photoresist layer 142b. Here, the material of the first passivation layer 172a and the second passivation layer 172b is, for example, nickel.

Referring to FIG. 1L, a third patterned photoresist layer 144a and a fourth patterned photoresist layer 144b are respectively formed on the first patterned photoresist layer 142a and the second patterned photoresist layer 142b, and expose a part of the first passivation layer 172a and a part of the second passivation layer 172b.

Referring to FIGS. 1L and 1M, the parts of the first passivation layer 172a and the second passivation layer 172b exposed out of the third patterned photoresist layer 144a and the fourth patterned photoresist layer 144b are removed to expose a part of the third patterned circuit layer 160a and a part of the fourth patterned circuit layer 160b.

Referring to FIG. 1N, a third passivation layer 174a and a fourth passivation layer 174b are formed respectively on the part of the third patterned circuit layer 160a and a part of the fourth patterned circuit layer 160b exposed by the third patterned photoresist layer 144a and the fourth patterned photoresist layer 144b, in which the first passivation layer 172a remained on the third patterned circuit layer 160a and the third passivation layer 174a form a first surface passivation layer 170a, and the second passivation layer 172b remained on the fourth patterned circuit layer 160b and the fourth passivation layer 174b form the second surface passivation layer 170b. Here, the material of the third passivation layer 174a and the fourth passivation layer 174b is, for example, nickel-gold. In this way, the first surface passivation layer 170a and the second surface passivation layer 170b are respectively formed on the third patterned circuit layer 160a and the fourth patterned circuit layer 160b.

It should be noted that, the present invention does not limit the manner of forming the first surface passivation layer 170a and the second surface passivation layer 170b. In other embodiments, after the step shown in FIG. 1L, that is, after the step of forming the third patterned photoresist layer 144a and the fourth patterned photoresist layer 144b, referring to FIG. 1N', a third passivation layer 174a' and a fourth passivation layer 174b' may also be directly formed on the part of the first passivation layer 172a' and the part of the second passivation layer 172b' that are exposed by the third patterned photoresist layer 144a and the fourth patterned photoresist layer 144b, in which the first passivation layer 172a' and the third passivation layer 174a' form a first surface passivation layer 170a', and the second passivation layer 172b' and the fourth passivation layer 174b' form the second surface passivation layer 170b'.

Referring to FIG. 1O, the first patterned photoresist layer 142a, the second patterned photoresist layer 142b, the third patterned photoresist layer 144a and the fourth patterned photoresist layer 144b are removed to expose a part of the first plating seed layer 130a, a part of the second plating seed layer 130b, the first surface passivation layer 170a, and the second surface passivation layer 170b.

Referring to FIG. 1P, the first surface passivation layer 170a and the second surface passivation layer 170b are used as an etching mask to remove a part of the first plating seed layer 130a and a part of the first copper foil layer 125a below the first plating seed layer and a part of the second plating seed layer 130b and a part of the second copper foil layer 125b below the second plating seed layer that are exposed out of the third patterned circuit layer 160a and the fourth patterned circuit layer 160b, to expose the first dielectric layer 120a and the second dielectric layer 120b. Since the third patterned circuit layer 160a and the fourth patterned circuit layer 160b respectively include the first surface passivation layer 170a and the second surface passivation layer 170b, and the third passivation layer 174a and the fourth passivation layer 174b are surrounded by the first passivation layer 172a and the second passivation layer 172b respectively, during etching process, the third patterned circuit layer 160a and the fourth patterned circuit layer 160b may be prevented from being eroded by the etching fluid, which has a desirable process reliability.

Finally, referring to FIG. 1Q, a stripping procedure is performed to remove a part of the first surface passivation layer 170a and a part of the second surface passivation layer 170b, that is, the first passivation layer 172a remained on the third patterned circuit layer 160a and the second passivation layer 172b remained on the fourth patterned circuit layer 160b are removed. In this way, the third patterned circuit layer 160a and the fourth patterned circuit layer 160b merely includes the third passivation layer 174a of the first surface passivation layer 170a and the fourth passivation layer 174b of the second surface passivation layer 170b respectively. Here, the third patterned circuit layer 160a covered by the first surface passivation layer 170a may be considered as a bonding pad, and the third patterned circuit layer 160a not covered by the first surface passivation layer 170a is referred to as a common circuit structure. The fourth patterned circuit layer 160b covered by the second surface passivation layer 170b may be considered as a bonding pad, and the fourth patterned circuit layer 160b not covered by the second surface passivation layer 170b is referred to as a common circuit structure. The manufacturing of the circuit board structure 100 has been completed by now.

It should be noted that, if the step shown in FIG. 1N' is used, the third passivation layer 174a' and the fourth passivation layer 174b' are directly formed on a part of the first passivation layer 172a' and a part of the second passivation layer 172b' that are exposed by the third patterned photoresist layer 144a and the fourth patterned photoresist layer 144b, and then when the step shown in FIG. 1Q is performed, the parts of the first passivation layer 172a' and the second passivation layer 172b' exposed out of the third passivation layer 174a' and the fourth passivation layer 174b' are respectively removed. In this way, the third patterned circuit layer 160a includes the third passivation layer 174a' of the first surface passivation layer 170a' and the first passivation layer 172a', and the fourth patterned circuit layer 160b includes the fourth passivation layer 174b' of the second surface passivation layer 170b' and the first passivation layer 172b'.

As for the structure, referring to FIG. 1Q, a circuit board structure 100 of this embodiment includes a core circuit structure 110, a first dielectric layer 120a, a second dielectric layer 120b, a first conductive blind via structure 150a, a second conductive blind via structure 150b, a third patterned circuit layer 160a, a fourth patterned circuit layer 160b, a first surface passivation layer 170a and a second surface passivation layer 170b. The core circuit structure 110 includes a first patterned circuit layer 118a and a second patterned circuit layer 118b that are respectively located on two opposite sides of the core circuit structure 110. The first dielectric layer 120a is superimposed on one side of the core circuit structure 110 including the first patterned circuit layer 118a, and includes at least one first blind via B1 exposing a part of the first patterned circuit layer 118a. The second dielectric layer 120b is superimposed on one side of the core circuit structure 110 including the second patterned circuit layer 118b, and includes at least one second blind via B2 exposing a part of the second patterned circuit layer 118b.

The first conductive blind via structure 150a is configured in the first blind via B1. The second conductive blind via structure 150b is configured in the second blind via B2. The third patterned circuit layer 160a is configured on the first dielectric layer 120a, exposes a part of the first dielectric layer 120a, and is electrically connected to the first patterned circuit layer 118a through the first conductive blind via structure 150a. The fourth patterned circuit layer 160b is configured on the second dielectric layer 120b, exposes a part of the second dielectric layer 120b, and is electrically connected to the second patterned circuit layer 118b through the second conductive blind via structure 150b. The first surface passivation layer 170a (or the first surface passivation layer 170a') is configured on the third patterned circuit layer 160a, and exposes a part of the third patterned circuit layer 160a, in which the material of the first surface passivation layer (or the first surface passivation layer 170a') is, for example, nickel-gold (or nickel and nickel-gold). The second surface passivation layer 170b (or the second surface passivation layer 170b') is configured on the fourth patterned circuit layer 160b, and exposes a part of the fourth patterned circuit layer 160b, in which the material of the second surface passivation layer 170b (or the second surface passivation layer 170b') is, for example, nickel-gold (or nickel and nickel-gold).

In addition, the circuit board structure 100 of this embodiment further includes a first copper foil layer 125a, a second copper foil layer 125b, a first plating seed layer 130a, and a second plating seed layer 130b. The first copper foil layer 125a is configured between the third patterned circuit layer 160a and the first dielectric layer 120a, and exposes a part of the first dielectric layer 120a. The second copper foil layer 125b is configured between the fourth patterned circuit layer 160b and the second dielectric layer 120b, and exposes a part of the second dielectric layer 120b. The first plating seed layer 130a is configured between the third patterned circuit layer 160a and the first copper foil layer 125a, and on an inner wall of the first blind via B1. The second plating seed layer 130b is configured between the fourth patterned circuit layer 160b and the second copper foil layer 125b, and on an inner wall of the second blind via B2.

In this embodiment, the first surface passivation layer 170a (or the first surface passivation layer 170a') and the second surface passivation layer 170b (or the second surface passivation layer 170b') are respectively formed on the third patterned circuit layer 160a and the fourth patterned circuit layer 160b through the patterned photoresist layer (including a first patterned photoresist layer 142a, a second patterned photoresist layer 142b, a third patterned photoresist layer 144a, and a fourth patterned photoresist layer 144b). Afterwards, the first surface passivation layer 170a (or the first surface passivation layer 170a') and the second surface passivation layer 170b (or the second surface passivation layer 170b') are used as etching masks to remove the first copper foil layer 125a and the second copper foil layer 125b that are exposed out of the third patterned circuit layer 160a and the fourth patterned circuit layer 160b, to expose the first dielectric layer 120a and the second dielectric layer 120b. In this way, in this embodiment, it is not required to first form the conventional plating bar in the circuit layer, the first surface passivation layer 170a (or the first surface passivation layer 170a') and the second surface passivation layer 170b (or the second surface passivation layer 170b') can be formed on a surface of a bonding pad to be formed by the third patterned circuit layer 160a and the fourth patterned circuit layer 160b. Therefore, the circuit board structure 100 of this embodiment may have great freeness in circuit layout.

Figure 1R:
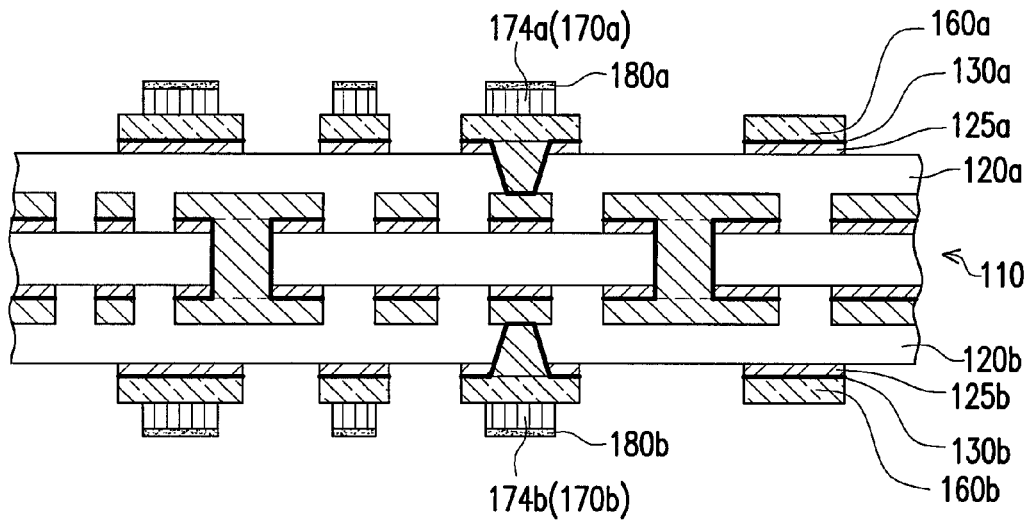
Figure 1S:
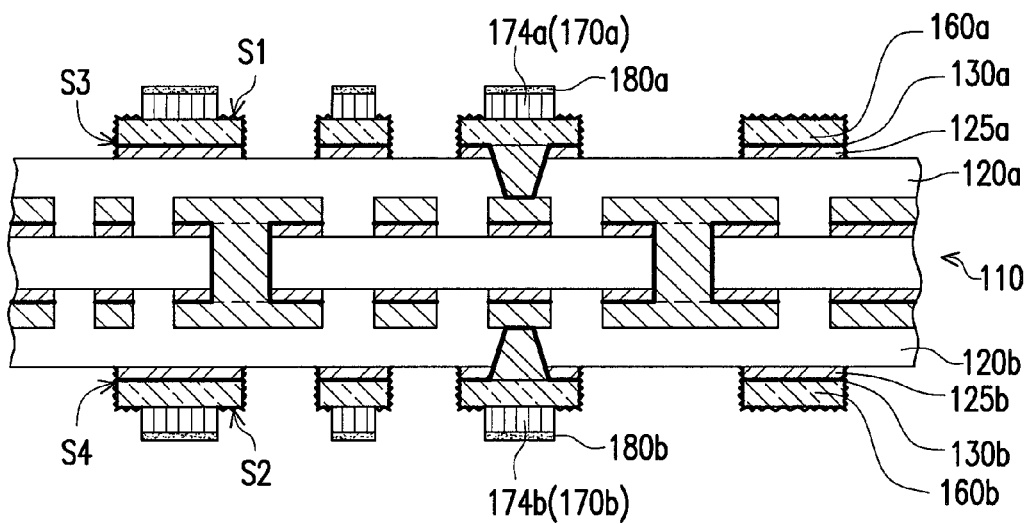
Figure 1T:
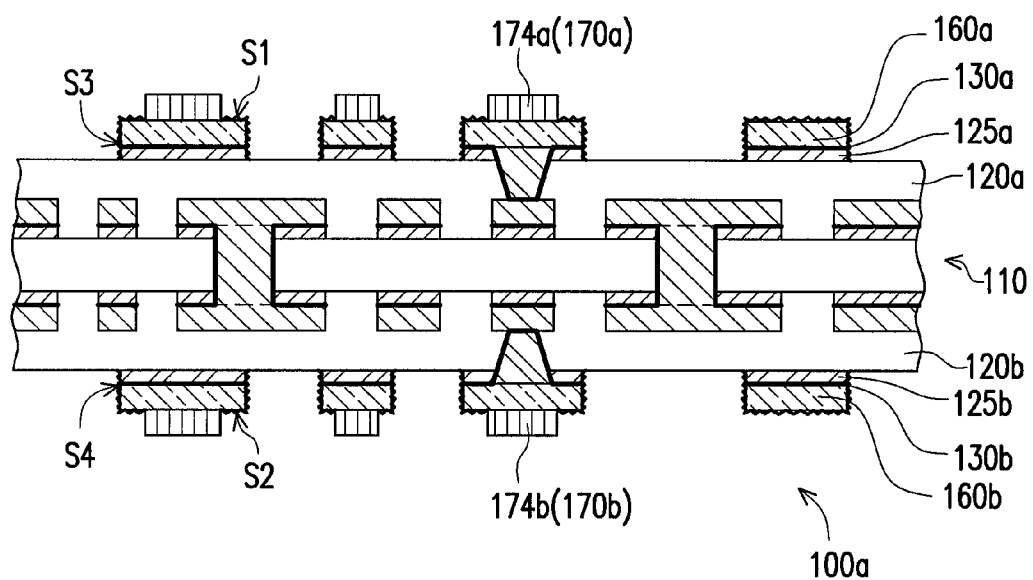

FIG. 1R to FIG. 1T are schematic sectional diagrams of partial steps of a manufacturing method of a circuit board structure according to another embodiment of the present invention. In order to increase reliability of subsequent paste coating (not shown), that is, effectively limit the flowing of the paste, after the step shown in FIG. 1Q is performed, that is, after a part of the first surface passivation layer 170a (or the first surface passivation layer 170a') and a part of the second surface passivation layer 170b (or the second surface passivation layer 170b') are removed, referring to FIG. 1R, a first surface coating layer 180a and a second surface coating layer 180b are respectively formed on the remained first surface passivation layer 170a (or the first surface passivation layer 170a') and the remained second surface passivation layer 170b (or the second surface passivation layer 170b').

Then, referring to FIG. 1S, brown-oxide processing is performed on the third patterned circuit layer 160a, the fourth patterned circuit layer 160b, the remained first plating seed layer 130a and the first copper foil layer 125a below the first plating seed layer, and the remained second plating seed layer 130b and the second copper foil layer 125b below the second plating seed layer that are exposed out of the first surface coating layer 180a and the second surface coating layer 180b, so that a part of the third patterned circuit layer 160a and a part of the fourth patterned circuit layer 160b exposed by the first surface passivation layer 170a (or the first surface passivation layer 170a') and the second surface passivation layer 170b (or the second surface passivation layer 170W) respectively form a first roughened surface S1 and a second roughened surface S2, lateral edges of the third patterned circuit layer 160a, the first plating seed layer 130a, and the first copper foil layer 125a form a third roughened surface S3, and lateral edges of the fourth patterned circuit layer 160b, the second plating seed layer 130b, and the second copper foil layer 125b form a fourth roughened surface S4.

Afterwards, referring to FIG. 1T, the first surface coating layer 180a and the second surface coating layer 180b are removed to expose the remained first surface passivation layer 170a (or the first surface passivation layer 170a') and the remained second surface passivation layer 170b (or the second surface passivation layer 170W). The manufacturing of the circuit board structure 100a has been completed by now.

Based on the above description, since in the present invention, the surface passivation layer is first formed on the patterned circuit layer through the patterned photoresist layer, and the surface passivation layer is used as the etching mask to remove the copper, foil layer exposed out of the patterned circuit layer, to expose the dielectric layer, the present invention is not required to first form the conventional plating bar in the circuit layer, and the surface passivation layer can be formed on the surface of a bonding pad to be formed by the circuit layer. In this way, the circuit board structure of the present invention may have great freeness in circuit layout.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a circuit board structure, comprising:
   compressing a first dielectric layer and a first copper foil layer located on the first dielectric layer onto a first patterned circuit layer of a core circuit structure, and compressing a second dielectric layer and a second copper foil layer located on the second dielectric layer onto a second patterned circuit layer of the core circuit structure, wherein the first patterned circuit layer and the second patterned circuit layer are respectively located on two opposite sides of the core circuit structure;
   forming at least one first blind via extending from the first copper foil layer to the first patterned circuit layer, and forming at least one second blind via extending from the second copper foil layer to the second patterned circuit layer, wherein the first blind via and the second blind via respectively expose parts of the first patterned circuit layer and the second patterned circuit layer;
   forming a first plating seed layer on the first copper foil layer and in the first blind via, and forming a second plating seed layer on the second copper foil layer and in the second blind via, wherein the first plating seed layer and the second plating seed layer respectively cover an inner wall of the first blind via and an inner wall of the second blind via;
   forming a first conductive blind via structure and a second conductive blind via structure in the first blind via and the second blind via respectively, wherein the first conductive blind via structure and the second conductive blind via structure are respectively aligned with the first plating seed layer located on the first copper foil layer and the second plating seed layer located on the second copper foil layer;
   forming a third patterned circuit layer and a fourth patterned circuit layer on the first plating seed layer and the second plating seed layer respectively, wherein the third patterned circuit layer and the fourth patterned circuit layer are electrically connected to the first patterned circuit layer and the second patterned circuit layer respectively through the first conductive blind via structure and the second conductive blind via structure;
   forming a first surface passivation layer and a second surface passivation layer on the third patterned circuit layer and the fourth patterned circuit layer respectively;
   using the first surface passivation layer and the second surface passivation layer as an etching mask to remove a part of the first plating seed layer and a part of the first copper foil layer below the first plating seed layer and a part of the second plating seed layer and a part of the second copper foil layer below the second plating seed layer that are exposed out of the third patterned circuit layer and the fourth patterned circuit layer, to expose the first dielectric layer and the second dielectric layer; and
   removing a part of the first surface passivation layer and a part of the second surface passivation layer, to expose a part of the third patterned circuit layer and a part of the fourth patterned circuit layer.

2. The manufacturing method of the circuit board structure according to claim 1, wherein the step of respectively forming the first conductive blind via structure and the second conductive blind via structure in the first blind via and the second blind via comprises:
   forming a first photoresist layer and a second photoresist layer on the first plating seed layer and the second plating seed layer respectively, wherein the first photoresist layer and the second photoresist layer at least expose a part of the first plating seed layer and a part of the second plating seed layer located on the first blind via and the second blind via;
   using the first photoresist layer and the second photoresist layer as plating masks to plate a conductive material on parts of the first plating seed layer and the second plating seed layer that are not covered by the first photoresist layer and the second photoresist layer;
   removing the first photoresist layer and the second photoresist layer, to expose a part of the first plating seed layer and a part of the second plating seed layer; and
   performing a grinding step to remove a part of the conductive material and form the first conductive blind via structure and the second conductive blind via structure aligned with the first plating seed layer located on the first copper foil layer and the second plating seed layer located on the second copper foil layer.

3. The manufacturing method of the circuit board structure according to claim 1, wherein the step of forming the third patterned circuit layer and the fourth patterned circuit layer on the first plating seed layer and the second plating seed layer comprises:
   forming a first patterned photoresist layer and a second patterned photoresist layer on the first plating seed layer and the second plating seed layer respectively; and
   using the first patterned photoresist layer and the second patterned photoresist layer as plating masks to plate the third patterned circuit layer and the fourth patterned circuit layer on the first plating seed layer and the second plating seed layer exposed out of the first patterned photoresist layer and the second patterned photoresist layer.

4. The manufacturing method of the circuit board structure according to claim 3, wherein the step of forming the first surface passivation layer and the second surface passivation layer comprises:
   forming a first passivation layer and a second passivation layer on the third patterned circuit layer and the fourth patterned circuit layer respectively;
   forming a third patterned photoresist layer and a fourth patterned photoresist layer on the first patterned photoresist layer and the second patterned photoresist layer respectively, wherein the third patterned photoresist layer and the fourth patterned photoresist layer respectively expose parts of the first passivation layer and the second passivation layer;
   removing parts of the first passivation layer and the second passivation layer exposed out of the third patterned photoresist layer and the fourth patterned photoresist layer to expose a part of the third patterned circuit layer and a part of the fourth patterned circuit layer;
   forming a third passivation layer and a fourth passivation layer on a part of the third patterned circuit layer and a part of the fourth patterned circuit layer that are exposed by the third patterned photoresist layer and the fourth patterned photoresist layer, wherein the first passivation layer remained on the third patterned circuit layer and the third passivation layer form the first surface passivation layer, and the second passivation layer remained on the fourth patterned circuit layer and the fourth passivation layer form the second surface passivation layer; and removing the first patterned photoresist layer, the second patterned photoresist layer, the third patterned photoresist layer and the fourth patterned photoresist layer, to expose a part of the first plating seed layer, a part of the second plating seed layer, the first surface passivation layer and the second surface passivation layer.

5. The manufacturing method of the circuit board structure according to claim 4, wherein the step of removing a part of the first surface passivation layer and a part of the second surface passivation layer comprises:

performing a stripping procedure, to remove the first passivation layer remained on the third patterned circuit layer and the second passivation layer remained on the fourth patterned circuit layer.

6. The manufacturing method of the circuit board structure according to claim 3, wherein the step of forming the first surface passivation layer and the second surface passivation layer comprises:

forming a first passivation layer and a second passivation layer on the third patterned circuit layer and the fourth patterned circuit layer respectively;

forming a third patterned photoresist layer and a fourth patterned photoresist layer on the first patterned photoresist layer and the second patterned photoresist layer respectively, wherein the third patterned photoresist layer and the fourth patterned photoresist layer respectively expose a part of the first passivation layer and a part of the second passivation layer;

forming a third passivation layer and a fourth passivation layer on a part of the first passivation layer and a part of the second passivation layer exposed by the third patterned photoresist layer and the fourth patterned photoresist layer, wherein the first passivation layer and the third passivation layer form the first surface passivation layer, and the second passivation layer and the fourth passivation layer form the second surface passivation layer; and removing the first patterned photoresist layer, the second patterned photoresist layer, the third patterned photoresist layer and the fourth patterned photoresist layer, to expose a part of the first plating seed layer, a part of the second plating seed layer, the first surface passivation layer and the second surface passivation layer.

7. The manufacturing method of the circuit board structure according to claim 6, wherein the step of removing a part of the first surface passivation layer and a part of the second surface passivation layer comprises:

performing a stripping procedure, to remove a part of the first passivation layer and a part of the second passivation layer that are exposed out of the third passivation layer and the fourth passivation layer.

8. The manufacturing method of the circuit board structure according to claim 1, further comprising:

removing a part of the first surface passivation layer and a part of the second surface passivation layer, and then forming a first surface coating layer and a second surface coating later on the remained first surface passivation layer and the remained second surface passivation layer;

performing brown-oxide processing on the third patterned circuit layer, the fourth patterned circuit layer, the remained first plating seed layer and the first copper foil layer below the first plating seed layer, and the remained second plating seed layer and the second copper foil layer below the second plating seed layer that are exposed out of the first surface coating layer and the second surface coating layer; and removing the first surface coating layer and the second surface coating layer, to expose the remained first surface passivation layer and the remained second surface passivation layer.

* * * * *